(12) United States Patent
Frulio et al.

(10) Patent No.: US 7,447,071 B2
(45) Date of Patent: Nov. 4, 2008

(54) LOW VOLTAGE COLUMN DECODER SHARING A MEMORY ARRAY P-WELL

(75) Inventors: Massimiliano Frulio, Milan (IT); Stefano Surico, Milan (IT); Andrea Sacco, Alessandria (IT); Davide Manfre, Pandino (IT)

(73) Assignee: Atmel Corporation, San Jose, CA (US)

( * ) Notice: Subject to any disclaimer, the term of this patent is extended or adjusted under 35 U.S.C. 154(b) by 169 days.

(21) Appl. No.: 11/557,627

(22) Filed: Nov. 8, 2006

(65) Prior Publication Data

US 2008/0123415 A1  May 29, 2008

(51) Int. Cl.
*G11C 11/34* (2006.01)
(52) U.S. Cl. .............................. 365/185.11; 365/230.03; 365/230.06
(58) Field of Classification Search ............ 365/185.11, 365/230.06, 185.27, 230.02, 230.05, 189.02, 365/185.23, 230.03
See application file for complete search history.

(56) References Cited

U.S. PATENT DOCUMENTS

| | | | |
|---|---|---|---|
| 5,966,341 A | 10/1999 | Takahashi et al. | |
| 6,064,623 A | 5/2000 | Ha | |
| 6,160,753 A | 12/2000 | Shibayama | |
| 6,351,413 B1* | 2/2002 | Micheloni et al. | 365/185.11 |
| 6,407,952 B1 | 6/2002 | Kitsukawa et al. | |
| 6,870,788 B2 | 3/2005 | Shimizu et al. | |
| 7,016,238 B2 | 3/2006 | Shimizu et al. | |
| 2003/0081492 A1* | 5/2003 | Farrell et al. | 365/238.5 |
| 2006/0023510 A1 | 2/2006 | Watanabe | |
| 2006/0146639 A1 | 7/2006 | Fasoli et al. | |

* cited by examiner

*Primary Examiner*—Dang T Nguyen
(74) *Attorney, Agent, or Firm*—Schwegman, Lundberg & Woessner, P.A.

(57) ABSTRACT

A plurality of memory sub-arrays are formed in a p-well region. Each of the memory sub-arrays has at least one first-level column decoder that includes a plurality of low-voltage MOS selector transistors that are also formed within the p-well. A last-level decoder is formed outside of the p-well region and includes high-voltage MOS transistors to provide an output signal to one of an array of sense amplifiers. During a memory erase mode of operation, a high voltage is provided to bias the p-well region and a plurality of high-voltage switches are activated to provide a high voltage to gate terminals of the selector transistor in the first-level column decoders. One or more intermediate-level column decoders are formed as low-voltage selector transistors in the p-well between the first-level column decoder and the last-level column decoder. Each of the intermediate-level column decoders also has a high-voltage switch that is activated during a memory erase mode of operation to provide a high voltage to gate terminals of the intermediate-level column decoders.

19 Claims, 5 Drawing Sheets

LOW VOLTAGE COLUMN DECODER SHARING A MEMORY ARRAY P-WELL

TECHNICAL FIELD

The present invention relates to non-volatile memories having a hierarchical address decoding organization.

BACKGROUND ART

Non-volatile memory devices are widely used in portable systems, such as, for example, laptop computers, personal digital assistants (PDAs), mobile telephones, and various other portable devices and systems. Most of these non-volatile memory devices require a high voltage supply that is internally generated to optimize power consumption of a portable device and that provides a system designer with more. Non-volatile memories store binary information whether or not power is supplied to the memory, which is very useful in portable systems.

Non-volatile memories are realized using floating gate devices, which store information by changing their physical state to two or more physical states. Different physical states are obtained by changing the threshold voltage of the floating gate device by means of injection and extraction of electrons into and out of a floating gate. Injection of electrons into the floating gate results in a higher threshold voltage, corresponding, for example, to a programmed state. Successive extraction of electrons from the floating gate brings down the threshold voltage, corresponding for instance to an erase state. Three or more states can provide operation as multi-level memories.

Injection and extraction of electrons into and out of a floating gate require very high electric fields across the gate oxide and at the terminals of a floating gate device. These high electric fields are obtained by applying voltages higher than the normal power supply voltages. The physical states corresponding to the binary information result in two or more current levels, provided that the non-volatile memory cell is properly biased to read the binary information stored therein by the various charge levels in the floating gate.

For these reasons, non-volatile memories are provided with charge pumps to generate the high voltages needed to accomplished their read or write functions. These high voltages are routed to the memory cells to provide the required electric fields across their gate oxide layers. As a result of using high voltages, the column and row access paths to the memory cell must be realized using devices capable of sustaining high voltages.

Figure 1:
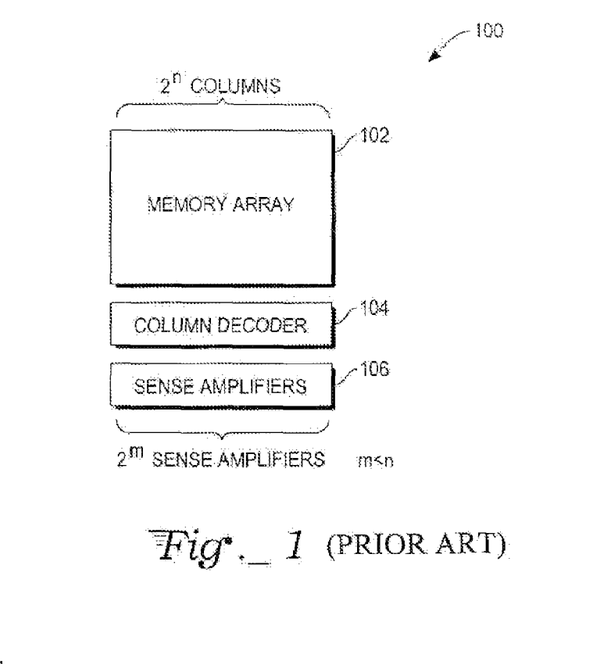
FIG. 1 is a block diagram that illustrates a typical column decoder that receives $2^n$ columns and services $2^m$ sense amplifiers.

FIG. 1 illustrates the organization of a column decoder. A memory device 100 has a memory array 102 with $2^n$ columns. A column decoder 104 routes all of the columns to $2^m$ sense amplifiers 106, where we assume m<n. The memory array 102 is usually formed to have thousands of columns. The number of sense amplifiers may vary from one logical word (16 sense amplifiers) to few words (64 or 128 sense-amplifiers) that are read at the same time.

Figure 2A:
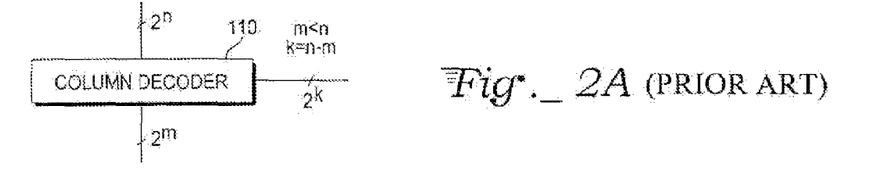
FIG. 2A is a block diagram that illustrates a column decoder 110 having one level of hierarchy.
Figure 2B:
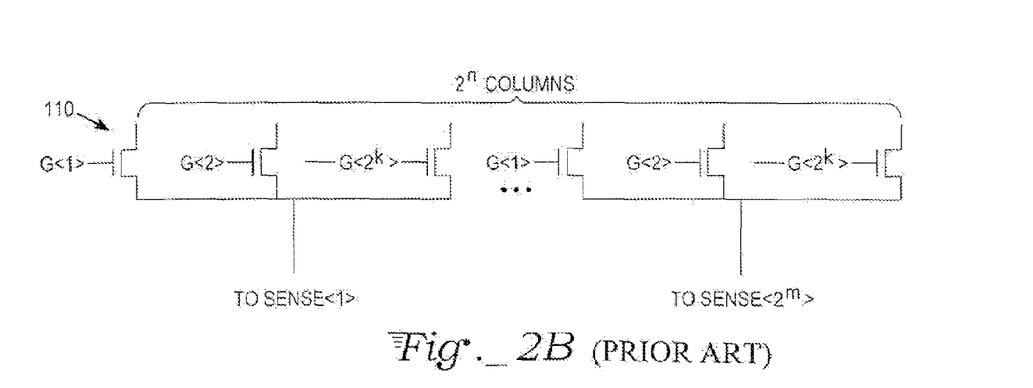
FIG. 2B is a circuit diagram that illustrates a column decoder as including $2^m$ groups of selectors transistors having $2^k$ selection transistors with $2^k$ control signals.

FIG. 2A illustrates a column decoder 110 having one level of hierarchy so that the number of needed selectors is equal to n (where n is the number of columns) and the number of independent control signals is $2^k$, where k is defined as k=n-m. FIG. 2B illustrates the column decoder 110 as including $2^m$ groups of selectors transistors, each of the $2^m$ groups having $2^k$ selection transistors with $2^k$ control signals G<1>-G<$2^k$> at respective gates thereof. Because n is an order of magnitude greater than m, a large number of control signals $2^k$ are needed.

Figure 3:
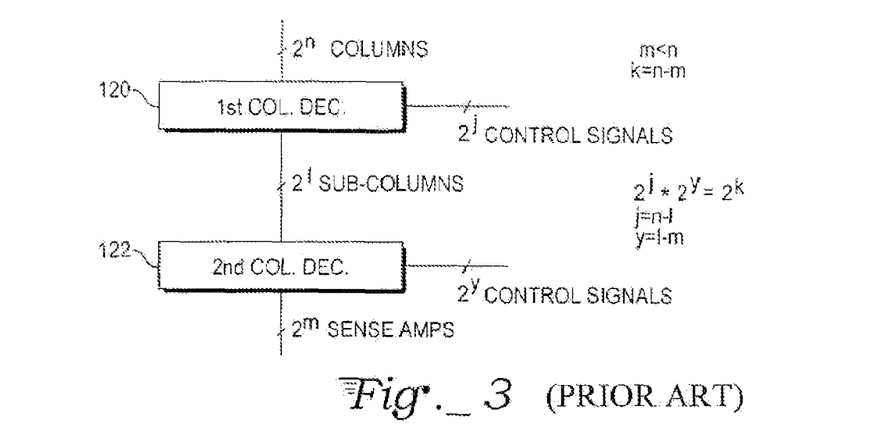
FIG. 3 is a block diagram that illustrates a configuration an increased level of hierarchy to reduce the number of control signals required to connect $2^n$ columns to $2^m$ sense amplifiers.

FIG. 3 illustrates a configuration where the level of hierarchy is increased to reduce the number of control signals required to connect $2^n$ columns to $2^m$ sense amplifiers. In this configuration, a first column decoder 120 has $2^n$ input columns that are connected to $2^1$ selectors, each having $2^j$ control signals. A second column decoder 122 has $2^1$ input columns that are connected to the $2^m$ sense amplifiers using $2^y$ control signals. It can be shown that: j=n-l, y=l-m, $(2^j \times 2^y)$=2k, and $(2^j+2^y) \ll 2^k$. This approach tends to minimize the number of control signals, increases the number of selectors, and attempts to find a trade-off between the number of control signals and the number of selectors.

Figure 4:
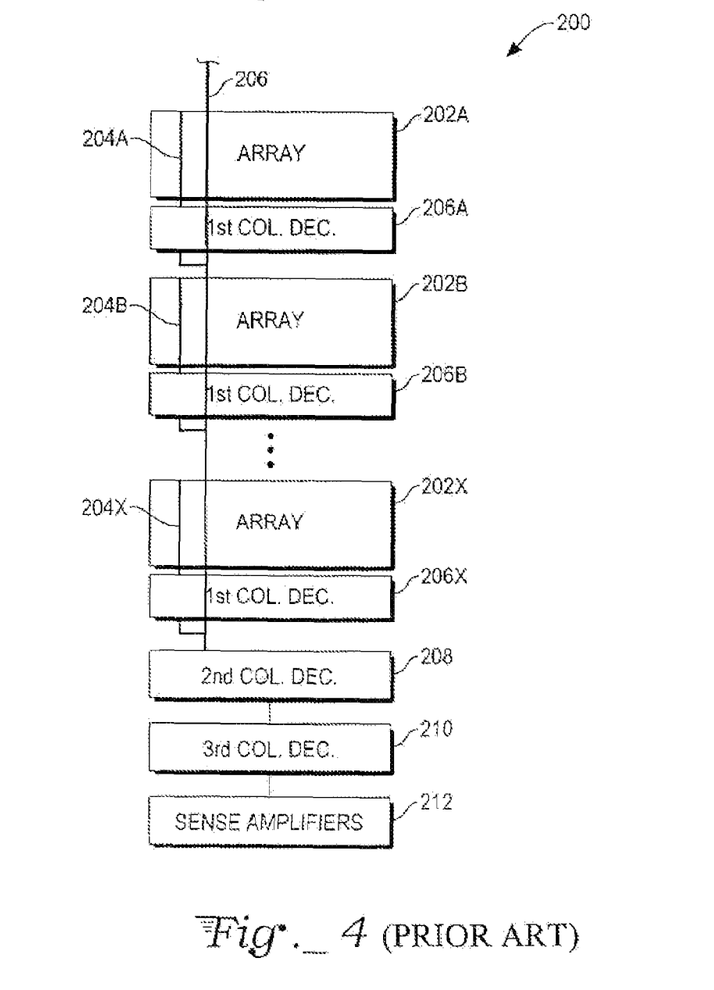
FIG. 4 is a block diagram that shows a memory organized with multiple independent sub-arrays each of which is connected to further column decoder levels.

FIG. 4 is presented to understand one aspect of this approach. FIG. 4 shows a memory 200 organized with multiple sub-arrays 202A, 202B, ..., 202x, where each sub-array is independent of the other sub-arrays. This organization is very common in non-volatile memory devices, since it improves the performance and the flexibility of the memory. Local columns 204A, 204B, 204x of each sub-array 202A, 202B, ..., 202x are connected to respective first level column decoders 206A, 204B, ..., 206x that are routed to global columns 206. A second level of column decoders 208 and, according to the architecture of FIG. 3, a third level of column decoders 210 connect the global column 206 to the sense amplifiers 212. The depth the hierarchy of the column decoder depends on the number of the local columns 204A, 204B, and the number of sense amplifiers 212.

Each of the sub-arrays 202A, 202B, ..., 202x in FIG. 4 is provided with the high voltage needed for program and erase operations. Recent generation of non-volatile memories perform the erase operation by applying a very high positive voltage to an isolated p-well of the memory array, while the gates of the memory cells are at a negative voltage or at ground potential, depending on the memory architecture or the process characteristics.

Figure 5:
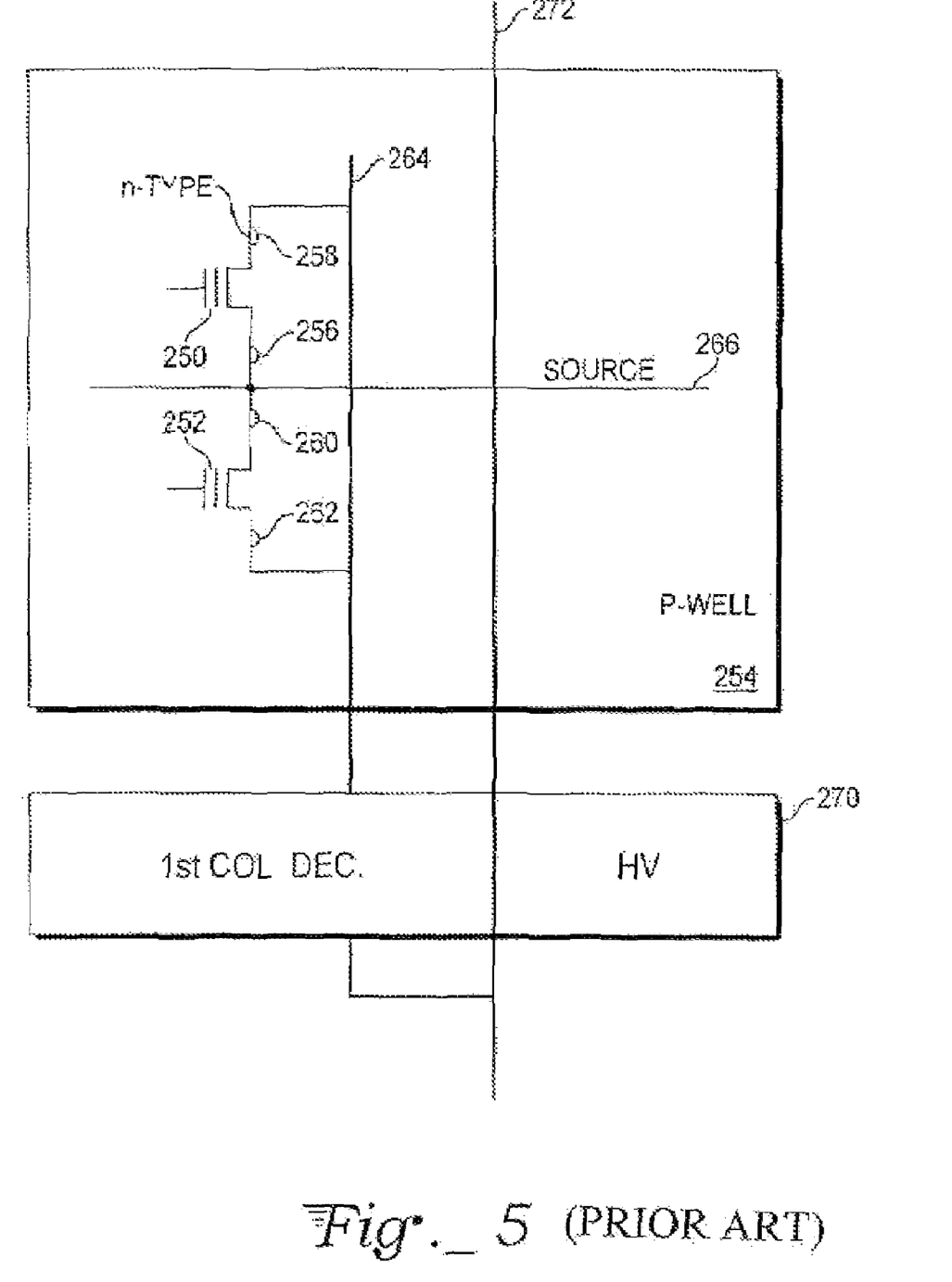
FIG. 5 is a circuit showing two single NMOS transistors floating-gate NMOS EEPROM memory cells that are formed in a p-well such that during an erase operation p-n junctions are forward biased so that local bit-lines are tied to a high positive voltage.

FIG. 5 illustrates two single NMOS transistor floating-gate NMOS EEPROM memory cells 250, 252 that are formed in a p-well 254. A source 256 and a drain 258 for the NMOS transistor 250 are formed as doped N-type regions in the p-well 254. A source 260 and a drain 262 for the NMOS transistors 252 are also formed as doped N-type regions in the p-well 254. The drains 258, 262 of these NMOS transistors are connected to a bit line, or column line 264. The source 256, 260 are connected to a source-line 266. The column line 264 provides one column input to a first column decoder 270 that provides selected outputs on the column output line 272. A number of similar EEPROM memory cells are provided in two rows of an EEPROM memory cell array. Each pair of memory cells is connected to a separate bit line or column line. Input signals to he first column decoder 270 select one of a group of bit line.

During an erase operation, the isolated p-well 254 is tied to a high positive voltage. The p-n junctions made by the p-well 254 and the drains 258, 262 of the memory cells are forwarded biased. This results in the local bit-line 264 being tied to the high positive voltage. This means that the first level of column decoders 270 must be realized with transistors capable of sustaining a high voltage like the one needed for the erase operation. This type of high-voltage MOS (HV-MOS) transistor has a huge area footprint and poor performance compared with the low-voltage MOS (LVMOS) type of transistors needed for just reading the memory cells. The first level decoder 270 has a number of selector transistors equal to the number of the columns, regardless the number of hierarchical levels of the memory array. Therefore, the first level decoder 270 has a significant effect on the chip area and performance of the memory array, since each sub-array has its own set of column decoders.

SUMMARY OF THE INVENTION

The present invention describes an architecture to minimize the footprint of the column decoder of a memory device and to increase the speed performance of the access path.

The present invention provides a non-volatile memory array having a hierarchical column decoding configuration with two or more levels of column decoding. The non-volatile memory array includes a substrate having a p-well region. A plurality of memory sub-arrays are formed in the p-well region. Each of the memory sub-arrays has at least one first-level column decoder for selecting one of the plurality of column output terminals. Each of the first-level column decoders includes a plurality of selector transistors. A last-level decoder is formed outside of the p-well region. The last-level decoder receives column output signals from the first-level column decoders.

Only the last-level column decoders are formed as high-voltage MOS device outside of said p-well region. Each of the last-level decoders provide an output signal to one of an array of sense amplifiers.

During a memory erase mode of operation, a high voltage is provided to bias the p-well region. Also during the memory erase mode of operation, a plurality of high-voltage switches are activated to provide a high voltage to gate terminals of the selector transistor in the first-level column decoders.

According to one aspect of the invention, the first-level column decoders are formed as low-voltage NMOS device in said p-well region. In contrast, the last-level column decoders are formed as high-voltage NMOS device outside of the p-well region.

According to another aspect of the invention, one or more intermediate-level column decoders are formed in the p-well between the first-level column decoder and the last-level column decoder. The last of the intermediate-level column decoders has a high-voltage switch that is activated during a memory erase mode of operation to provide a high voltage to gate terminals of the intermediate-level column decoders. The last of the intermediate-level column decoders are high voltage NMOS transistors.

The first-level column decoders are formed with MOS transistors that have one terminal connected to a column input, that have another terminal connected to a common output point, and that have gate terminals connected to decoder signals.

An advantage of an architecture according to the present invention are that the first levels of the column decoder, which have the highest number of selectors in the hierarchical decoding, are realized by means of low-voltage MOS (LVMOS) devices. Low-voltage MOS devices minimize the overall footprint of a column decoder and increasing the performance of the read access path. High-voltage (HVMOS) devices are only needed in the last hierarchical decoder level, which has the lower number of selector transistors. As a consequence, the lower number of threes last HVMOS devices can have their dimensions increased, if desired, to improve their speed performance with a minimum impact on the overall footprint of the column decoder circuitry.

BRIEF DESCRIPTION OF THE DRAWINGS

The accompanying drawings, which are incorporated in and form a part of this specification, illustrate embodiments of the invention and, together with the description, serve to explain the principles of the invention.

DETAILED DESCRIPTION

The present invention provides a memory configuration that reduces the footprint of a column decoder for a memory device, while increasing the speed of the access path to the memory.

Figure 6:
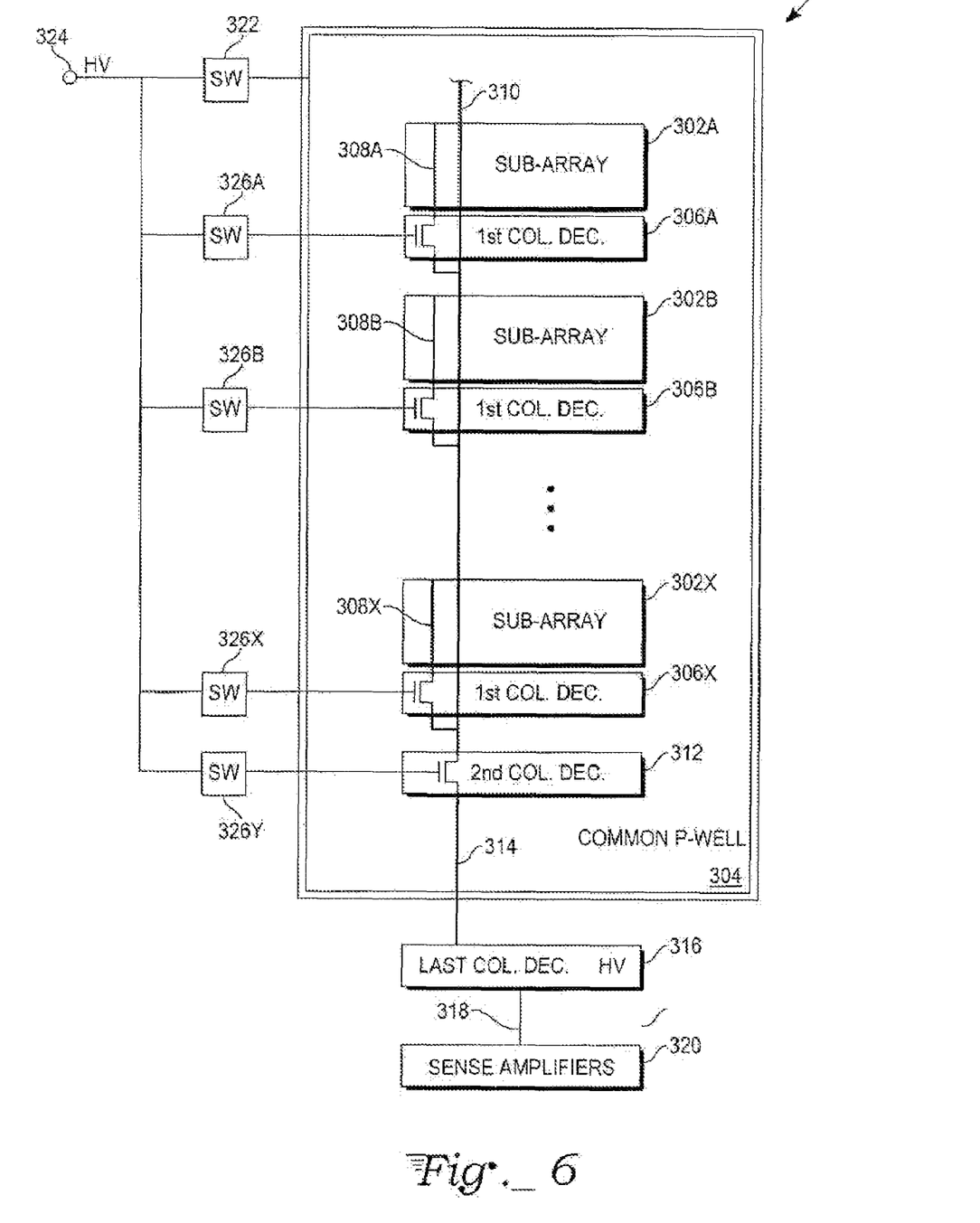
FIG. 6 is a block diagram that illustrates a non-volatile memory architecture according to the present with a reduced number of high-voltage decoder circuits.

FIG. 6 illustrates one embodiment of the present invention. A memory device 300 is provided with a plurality of sub-arrays 302A, 302B, . . . , 302x that share a common p-well region 304. A first level of column decoders 306A, 306B, . . . , 306x within the common p-well region 304 provide selected connections from local column lines 308A, 308B, . . . , 308x in the memory sub-arrays to a global column line 310.

To illustrate additional hierarchical levels of decoding, a second-level column decoder 312 shown inside the same common p-well region 304. Note that other levels of column decoders inside the same memory p-well region 304 may be added according to the number n of columns and m of sense amplifiers required. The second-level column decoder 312 has a global column line 314.

The last-level column decoder 316 is placed outside the common p-well region 304 of the memory array 300. The various decoders placed inside the common p-well region 304 are realized by means of low-level MOS (LVMOS) devices, while the last level column decoder 316 is realized with high-voltage MOS (HVMOS) transistor devices and provides signals on a bus 318 to sense amplifiers 320.

Figure 7:
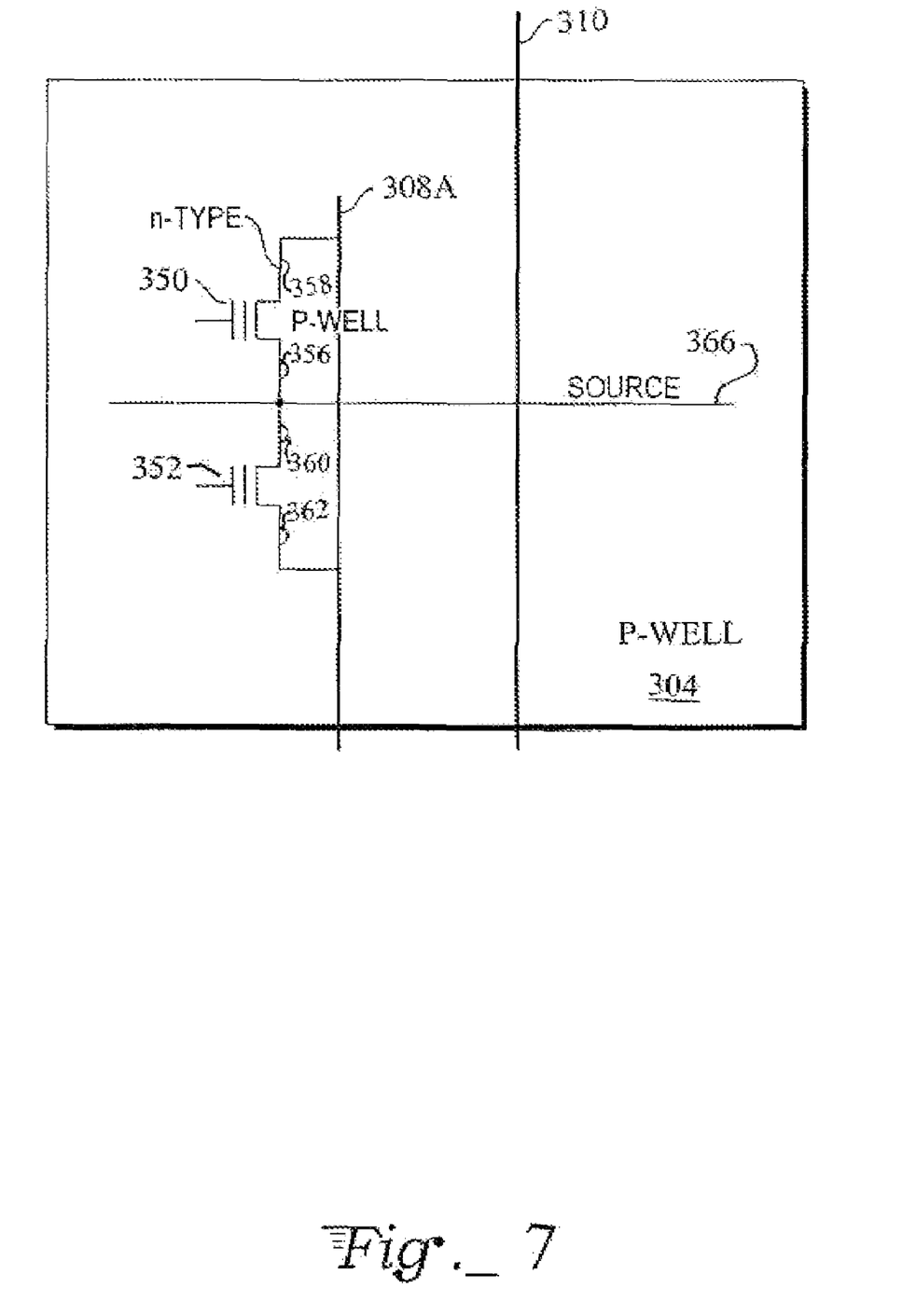
FIG. 7 is a circuit diagram showing two single-transistors floating gate NMOS EEPROM memory cells with a column decoder circuit.

FIG. 7 illustrates two single NMOS transistor floating-gate NMOS EEPROM memory cells 350, 352 that are formed in a p-well 304. A source 356 and a drain 358 for the NMOS transistor 350 are formed as doped N-type regions in the p-well 304. A source 360 and a drain 362 for the NMOS transistor 352 are also formed as doped N-type regions in the p-well 304. The drains 358, 362 of these NMOS transistors are connected to a bit line, or column line 308A. The sources 356, 360 are connected to a source-line 366. The column line 308A provides one column input to the first column decoder 306A that provides selected outputs on the column output line 308A. A number of similar EEPROM memory cells are provided in two rows of an EEPROM memory cell array. Each pair of memory cells is connected to a separate bit line or column line. Input signals to the first column decoder 306A select one of a group of bit lines.

During an erase operation, the isolated p-well 304 is tied to a high positive voltage through switch 322. The p-n junctions made by the p-well 354 and the drains 358, 362 of the memory cells are forward biased. This results in the local bit-line 308A being tied to the high positive voltage.

With reference to FIG. 6, during an erase operation, a high voltage is applied to the memory p-well region 304 through a high voltage switch 322 from a high-voltage terminal 324. High voltage switches 320A, 320B, . . . , 320x, 320y keep the gate of the selector transistors for the decoders 306A, 306B, . . . , 306x, 312 at the same high voltage level as the p-well region 304. This prevents damage to the low-voltage transistors in the selector devices because their terminals are at the same potential. It is noted that their drains and sources are actually at the voltage of the memory p-well region 304 minus −0.7V, which is the threshold voltage that turns on the p-n junctions between the p-well region 304 and n-doped drains and sources of the MOS transistors of the first and second column decoders. This bias condition is safe for low voltage MOS devices.

In this configuration, the global bit lines 310 and 314 are tied to the high voltage due to the forward bias of the p-n junctions for the decoder transistors of the first and second column decoders 306A, 306B, . . . , 306x, and 312. Therefore, only the last-level column decoder 318 is placed outside the memory p-well 304, and must be fabricated with HVMOS transistors to avoid damage. The last column decoder 316 also protects the low voltage circuitry of the sense amplifiers 320.

One advantage of the configuration according to the present invention is that the first levels of the column decoder, which have the greatest number of selectors in the hierarchical decoding scheme, are realized with LVMOS devices, which reduces the overall footprint of the column decoders. Another advantage is the increased speed of the LVMOS devices. Moreover, the HVMOS transistors are only used in the decoders 316 of the last hierarchical level, which requires a smaller number of selector transistors so that their dimensions may be increased to improve their speed performance with minimum impact on the overall footprint of the column decoder.

This innovative architecture of the present invention can be applied to any non-volatile memory array that has at least two hierarchical levels of column decoders, regardless to the number of sub-arrays. A number of combinations of sub-array sizes and hierarchical column decoder levels can be implemented, as required.

The foregoing description of a specific embodiment of the present invention has been presented for purposes of illustration and description. It is not intended to be exhaustive or to limit the invention to the precise forms disclosed, and obviously many modifications and variations are possible in light of the above teaching. The embodiment was chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

What is claimed is:

1. A non-volatile memory array having a hierarchical column decoding configuration with two or more levels of column decoding, comprising:
    a substrate having a p-well region;
    a plurality of memory sub-arrays that are formed in said p-well region, each of said memory sub-arrays having at least one first-level column decoder for selecting one of said plurality of column output terminals;
    a last-level decoder that is formed outside of said p-well region and that receives column output signals from the first-level column decoders;
    wherein said last-level column decoders are formed as high-voltage MOS device outside of said p-well region;
    a first high-voltage switch that is activated during a memory erase mode of operation to provide a high voltage to bias the p-well region; and
    a plurality of high-voltage switches that are activated during a memory erase mode of operation to provide a high voltage to respective gate terminals of the selector transistors in the first-level column decoders.

2. The non-volatile memory array of claim 1 wherein each of said last-level decoders provides an output signal to one of an array of sense amplifiers.

3. The non-volatile memory array of claim 1 wherein said first-level column decoders are formed as low-voltage NMOS device in said p-well region.

4. The non-volatile memory array of claim 1 wherein each of said last-level decoders provides an output signal to one of an array of sense amplifiers.

5. The non-volatile memory array of claim 1 wherein the first high-voltage switch is connected between a high voltage source terminal and the p-well region.

6. The non-volatile memory array of claim 1 wherein the plurality of high-voltage switches are connected between the high voltage source terminal and respective gate terminals of the selector transistors in the first-level column decoders.

7. The non-volatile memory array of claim 1 wherein said last-level column decoders are formed as high-voltage NMOS devices outside of said p-well region.

8. The non-volatile memory array of claim 1 including one or more intermediate-level column decoders that are formed in said p-well between the first-level column decoder and the last-level column decoder.

9. The non-volatile memory array of claim 1 wherein each of said intermediate-level column decoders has a high-voltage switch that is activated during a memory erase mode of operation to provide a high voltage to gate terminals of the intermediate-level column decoders.

10. The non-volatile memory array of claim 6 wherein the intermediate-level column decoders are low voltage NMOS transistors.

11. The non-volatile memory array of claim 1 wherein the first-level column decoders are formed with MOS transistors that have one terminal connected to a column input, that have another terminal connected to a common output point, and that have gate terminals connected to decoder signals.

12. A non-volatile memory array having a hierarchical column decoding configuration with two or more levels of column decoding, comprising:
    a substrate having a p-well region;
    a plurality of memory sub-arrays that are formed in said p-well region, each of said memory sub-arrays having at least one first-level column decoder for selecting one of said plurality of column output terminals;
    wherein each of the first-level column decoders includes a plurality of selector transistors;
    a last-level decoder that is formed outside of said p-well region and that receives column output signals from the first-level column decoders;
    wherein said last-level column decoders are formed as high-voltage MOS device outside of said p-well region;
    wherein each of said last-level decoders provide an output signal to one of an array of sense amplifiers;
    a first high-voltage switch that is connected between a high voltage source terminal and the p-well region and that is activated during a memory erase mode of operation to provide a high voltage to bias the p-well region; and a plurality of high-voltage switches that are connected between the high voltage source terminal and respective gate terminals of the selector transistors in the first-level column decoders and that are activated during a memory erase mode of operation to provide a high voltage to respective gate terminals of the selector transistors in the first-level column decoders.

13. The non-volatile memory array of claim 12 wherein said first-level column decoders are formed as low-voltage NMOS device in said p-well region.

14. The non-volatile memory array of claim 12 wherein said last-level column decoders are formed as high-voltage NMOS devices outside of said p-well region.

15. The non-volatile memory array of claim 12 wherein the first-level column decoders are formed with MOS transistors that have one terminal connected to a column input, that have another terminal connected to a common output point, and that have gate terminals connected to decoder signals.

16. The non-volatile memory array of claim 12 including:

one or more intermediate-level column decoders that are formed in said p-well between the first-level column decoder and the last-level decoder; and wherein each of said intermediate-level column decoders has a high-voltage switch that is activated during a memory erase mode of operation to provide a high voltage to gate terminals of the intermediate-level column decoders.

17. The non-volatile memory array of claim 12 wherein the intermediate-level column decoder are low voltage NMOS transistors.

18. A non-volatile memory array having a hierarchical column decoding configuration with two or more levels of column decoding, comprising:

a substrate having a p-well region;

a plurality of memory sub-arrays that are formed in said p-well region as low-voltage NMOS devices, each of said memory sub-arrays having at least one first-level column decoder for selecting one of said plurality of column output terminals;

wherein each of the first-level column decoders includes a plurality of selector transistors;

a last-level decoder that is formed outside of said p-well region and that receives column output signals from the first-level column decoders;

wherein said last-level column decoders are formed as high-voltage NMOS device outside of said p-well region;

wherein each of said last-level decoders provide an output signal to one of an array of sense amplifiers;

a first high-voltage switch that is connected between a high voltage source terminal and the p-well region and that is activated during a memory erase mode of operation to provide a high voltage to bias the p-well region; and a plurality of high-voltage switches that are connected between the high voltage source terminal and respective gate terminals of the selector transistors in the first-level column decoders and that are activated during a memory erase mode of operation to provide a high voltage to respective gate terminals of the selector transistors in the first-level column decoders.

19. The non-volatile memory array of claim 18 wherein the first-level column decoders and the last-level column decoders are formed with MOS transistors that have one terminal connected to a column input, that have another terminal connected to a common output point, and that have gate terminals connected to decoder signals.

* * * * *

UNITED STATES PATENT AND TRADEMARK OFFICE
CERTIFICATE OF CORRECTION

PATENT NO. : 7,447,071 B2  Page 1 of 1
APPLICATION NO. : 11/557627
DATED : November 4, 2008
INVENTOR(S) : Frulio et al.

It is certified that error appears in the above-identified patent and that said Letters Patent is hereby corrected as shown below:

In column 2, line 22, after "206A," delete "204B," and insert -- 206B, --, therefor.

In column 2, line 31, delete "voltage" and insert -- voltages --, therefor.

In column 2, line 43, delete "transistors" and insert -- transistor --, therefor.

In column 2, line 45, delete "source" and insert -- sources --, therefor.

In column 2, line 52, delete "he" and insert -- the --, therefor.

In column 2, line 53, delete "line." and insert -- lines. --, therefor.

In column 2, lines 56–57, delete "forwarded" and insert -- forward --, therefor.

In column 4, line 17, delete "transistors" and insert -- transistor --, therefor.

In column 4, line 52, delete "low-level" and insert -- low-voltage --, therefor.

In column 5, line 14, delete "gate" and insert -- gates --, therefor.

In column 7, line 24, in Claim 16, after "level" insert -- column --.

In column 7, line 31, in Claim 17, delete "decoder" and insert -- decoders --, therefor.

Signed and Sealed this

Thirteenth Day of January, 2009

JON W. DUDAS
*Director of the United States Patent and Trademark Office*